(12) United States Patent
Kim et al.

(10) Patent No.: US 11,813,832 B2
(45) Date of Patent: Nov. 14, 2023

(54) FABRIC-BASED SUBSTRATE AND ORGANIC ELECTRONIC DEVICE INCLUDING THE SAME

(71) Applicant: IUCF-HYU (Industry-University Cooperation Foundation Hanyang University), Seoul (KR)

(72) Inventors: Tae Whan Kim, Seoul (KR); Dae Hun Kim, Seoul (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 359 days.

(21) Appl. No.: 17/109,882

(22) Filed: Dec. 2, 2020

(65) Prior Publication Data

US 2021/0197517 A1 Jul. 1, 2021

(30) Foreign Application Priority Data

Dec. 27, 2019 (KR) .......................... 10-2019-0175904

(51) Int. Cl.
*B32B 5/02* (2006.01)
*C09J 9/00* (2006.01)
*C09J 175/04* (2006.01)
*B32B 27/30* (2006.01)
*B32B 17/10* (2006.01)
(Continued)

(52) U.S. Cl.
CPC .................. *B32B 5/02* (2013.01); *B32B 7/12* (2013.01); *B32B 17/10018* (2013.01); *B32B 27/306* (2013.01); *C09J 9/00* (2013.01); *C09J 163/00* (2013.01); *C09J 175/04* (2013.01); *H10K 50/16* (2023.02); *H10K 50/171* (2023.02); *H10K 50/182* (2023.02); *H10K 50/84* (2023.02); *H10K 71/12* (2023.02); *H10K 77/111* (2023.02); *B32B 2305/34* (2013.01); *B32B 2307/762* (2013.01);
(Continued)

(58) Field of Classification Search
CPC ....... B32B 5/02; B32B 7/12; B32B 2307/762; C09J 9/00; C09J 175/04; H10K 50/182; H10K 50/84; H10K 77/111; H10K 102/311
USPC .......................................... 313/509, 511, 512
See application file for complete search history.

(56) References Cited

U.S. PATENT DOCUMENTS

| 8,384,288 | B2 | 2/2013 | Su et al. | |
|---|---|---|---|---|
| 2010/0277065 | A1* | 11/2010 | Park | H05B 33/02 313/509 |
| 2018/0113331 | A1* | 4/2018 | Wang | G02F 1/0102 |

FOREIGN PATENT DOCUMENTS

| KR | 10-2009-0063172 A | 6/2009 |
|---|---|---|
| KR | 10-2013-0115399 A | 10/2013 |

(Continued)

*Primary Examiner* — Ruiyun Zhang
(74) *Attorney, Agent, or Firm* — NKL LAW; Jae Youn Kim

(57) ABSTRACT

Provided herein are a fabric-based substrate and an organic electronic device including the same. The fabric-based substrate includes a fabric layer having an upper surface and a lower surface. A plurality of electrodes are disposed on the upper surface of the fabric layer. An adhesive layer is provided on the upper surface and the lower surface of the fabric layer and filled at least some empty regions between the electrodes and the fabric layer, between the electrodes, and at least some pores in the fabric layer. A self-healing polymer layer is disposed on the adhesive layer located on the lower surface of the fabric layer.

14 Claims, 4 Drawing Sheets

(51) Int. Cl.

| | | |
|---|---|---|
| *C09J 163/00* | (2006.01) | |
| *B32B 7/12* | (2006.01) | |
| *H10K 50/16* | (2023.01) | |
| *H10K 50/84* | (2023.01) | |
| *H10K 50/17* | (2023.01) | |
| *H10K 50/10* | (2023.01) | |
| *H10K 71/12* | (2023.01) | |
| *H10K 77/10* | (2023.01) | |
| *H10K 102/00* | (2023.01) | |

(52) U.S. Cl.
CPC .... *B32B 2457/00* (2013.01); *H10K 2102/311* (2023.02)

(56) References Cited

FOREIGN PATENT DOCUMENTS

| KR | 10-2016-0032836 A | 3/2016 |
|---|---|---|
| WO | 2007/015710 A2 | 2/2007 |

* cited by examiner

I - I'

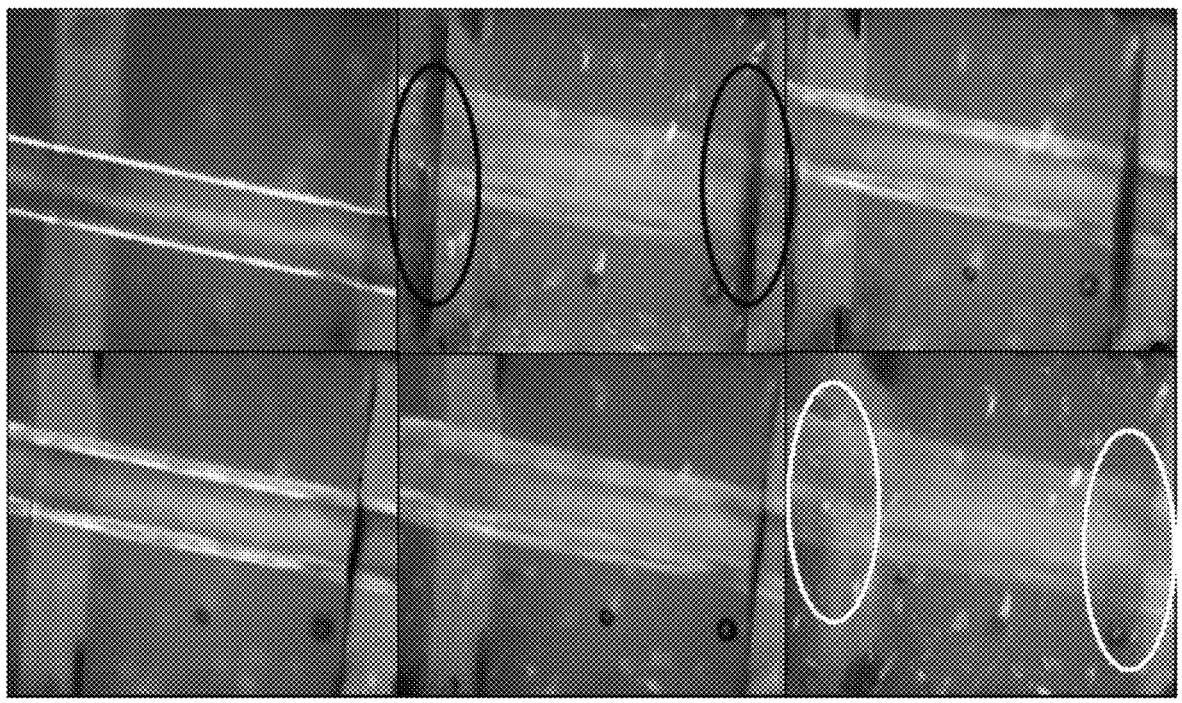
FIG.6A FIG.6B FIG.6C
FIG.6D FIG.6E FIG.6F
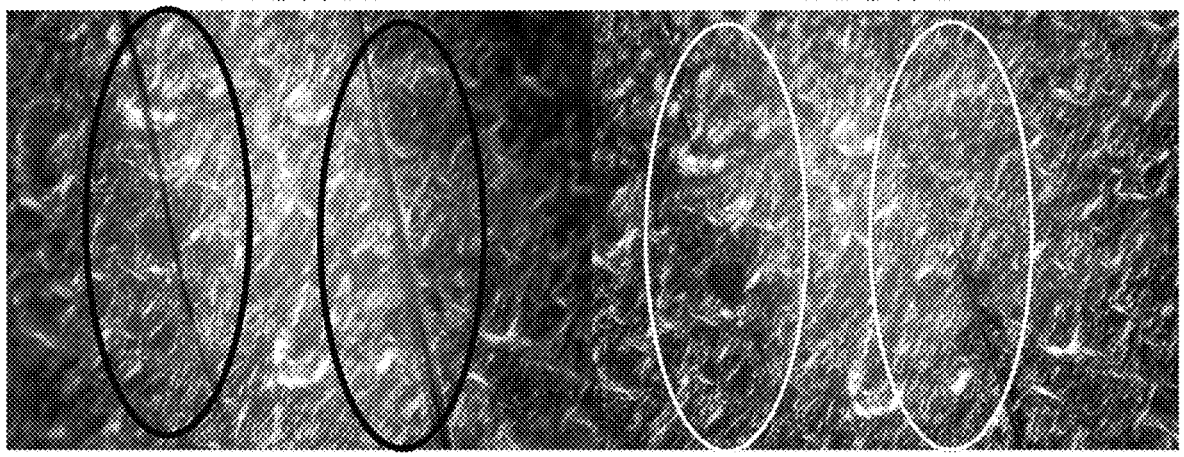
FIG.7A FIG.7B

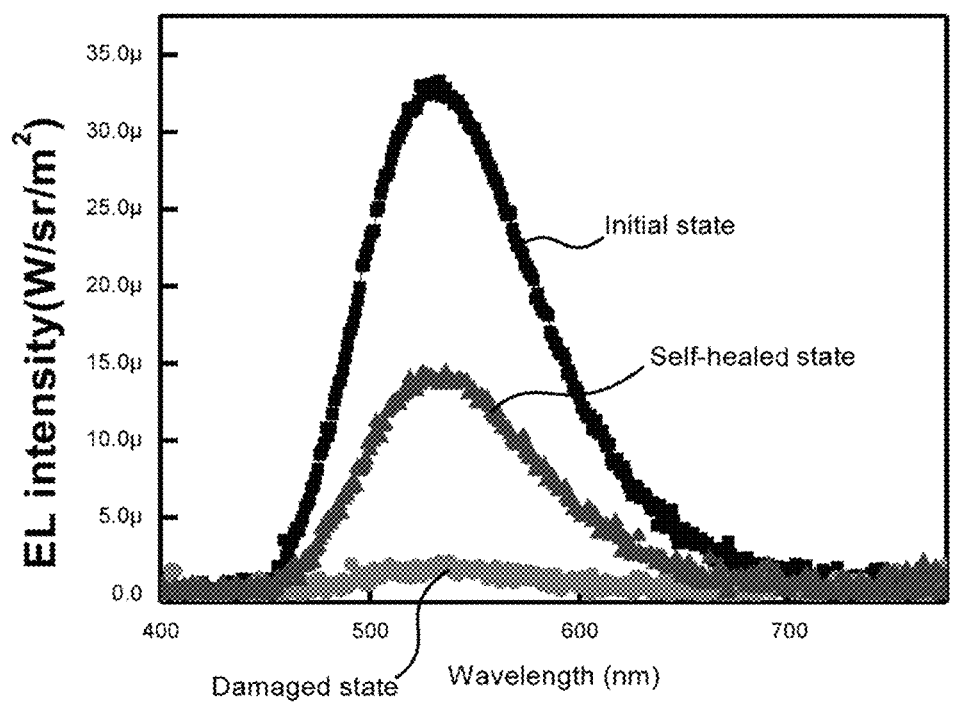

FABRIC-BASED SUBSTRATE AND ORGANIC ELECTRONIC DEVICE INCLUDING THE SAME

CLAIM FOR PRIORITY

This application claims priority to Korean Patent Application No. 2019-0175904 filed on Dec. 27, 2019 in the Korean Intellectual Property Office (KIPO), the entire contents of which are hereby incorporated by reference.

BACKGROUND

1. Technical Field

Example embodiments of the present invention relate in general to a flexible substrate and more specifically to a fabric substrate.

2. Related Art

Glass substrates used in display devices, frames, crafts, and containers have several advantages such as low coefficients of linear expansion, excellent gas barrier properties, high light transmittance, surface flatness, excellent heat resistance, and excellent chemical resistance but have disadvantages of being easily broken due to weakness against impact and heaviness due to high density.

Recently, as the interest in liquid crystals, organic light-emitting displays, and electronic papers has increased rapidly, research on replacing substrates of these display devices from glass to plastic has been actively carried out. When a glass substrate is replaced with a plastic substrate, an overall weight of a display device can be lightened, design flexibility can be provided to the display device, and the display device can be resistant to impact. Also, when the display device is manufactured through a serial processes using the plastic substrate, the plastic substrate can be economical compared to the glass substrate.

However, the plastic substrate may have a limitation in flexibility and also have a disadvantage of being not suitable for implementing a wearable device.

SUMMARY

Accordingly, example embodiments of the present invention are provided to substantially obviate one or more problems due to limitations and disadvantages of the related art. Example embodiments of the present invention provide a fabric substrate with excellent flexibility and an organic electronic device including the same.

It should be noted that objects of the present invention are not limited to the above-described objects, and other technical objects of the present invention will be apparent to those skilled in the art from the following description.

In some example embodiments, a fabric-based substrate is provided. The fabric-based substrate may include a fabric layer having an upper surface and a lower surface. A plurality of electrodes may be disposed on the upper surface of the fabric layer. An adhesive layer may be provided on the upper surface and the lower surface of the fabric layer and filled at least some empty regions between the electrodes and the fabric layer, between the electrodes, and at least some pores in the fabric layer. A self-healing polymer layer may be disposed on the adhesive layer located on the lower surface of the fabric layer.

The adhesive layer may be a shape memory polymer layer. The adhesive layer may be an amorphous thermosetting polyurethane layer. In addition, the adhesive layer may be a thiol-ene crosslinked polyurethane layer.

The self-healing polymer layer may be a polymer layer crosslinked by hydrogen bonds. The self-healing polymer layer may be a polymer layer containing polyvinyl alcohol. The self-healing polymer layer may be a mixture of polyvinyl alcohol and a polysaccharide.

In other example embodiments, a method of manufacturing a fabric-based substrate is provided. First, electrodes may be formed on a base substrate. A fabric layer may be disposed on the electrodes. A liquid adhesive may be applied on the fabric layer and then cured to form an adhesive layer. A self-healing polymer layer may be formed on the adhesive layer. The base substrate may be removed from the resultant in which the self-healing polymer layer is formed, thereby exposing the electrodes and the adhesive layer located between the electrodes.

The base substrate may be a glass substrate. The liquid adhesive may be a urethane-based or epoxy-based adhesive. The liquid adhesive may be applied using a spin coating method.

In still other example embodiments, an organic electronic device is provided. The organic electronic device may include a fabric layer having an upper surface and a lower surface. A plurality of electrodes may be disposed on the upper surface of the fabric layer. An adhesive layer may be provided on the upper surface and the lower surface of the fabric layer and filled at least some empty spaces between the electrodes and the fabric layer, between the electrodes, and at least some pores in the fabric layer. A self-healing polymer layer may be disposed on the adhesive layer located on the lower surface of the fabric layer. An organic functional layer may be disposed on the electrodes.

The organic functional layer may include an organic light-emitting layer or a photoactive layer, the electrodes may be first electrodes, and a second electrode may be disposed on the organic functional layer. At least one of a first charge injection/transport layer disposed between the first electrode and the organic functional layer and a second charge injection/transport layer disposed between the organic functional layer and the second electrode may be provided. An encapsulation film may be disposed on the organic functional layer.

BRIEF DESCRIPTION OF DRAWINGS

Example embodiments of the present invention will become more apparent by describing in detail example embodiments of the present invention with reference to the accompanying drawings, in which:

FIGS. 6A, 6B, 6C, 6D, 6E, and 6F are photographs illustrating a process in which, after cracks occurred in the PVA:Agr thin film of a fabric-based substrate obtained in Example of manufacturing fabric-based substrate, the cracks were repaired;

FIGS. 7A and 7B are photographs illustrating the shape memory capability of the fabric-based substrate obtained in Example of manufacturing fabric-based substrate; and FIG. 8 is a graph showing electroluminescence intensities according to wavelengths of an initial state, a damaged state, and a self-healed state of the organic light-emitting device obtained in Example of manufacturing organic light-emitting device.

DESCRIPTION OF EXAMPLE EMBODIMENTS

Hereinafter, in order to describe the present invention in more detail, exemplary embodiments of the present invention will be described in more detail with reference to the accompanying drawings. However, the present invention is not limited to the embodiments disclosed herein and may be implemented in other forms. In the accompanying drawings, when a layer is referred to as being "on" another layer or substrate, the layer may be formed directly on another layer or substrate, or a third layer may be interposed between the layer and another layer or substrate. In the present embodiments, the term "first," "second," or "third" is not intended to impose any limitation on components and should be understood as terms for distinguishing the components.

FIGS. 1, 2, 3A, 3B, 4, and 5 are schematic diagrams illustrating a method of manufacturing a fabric-based substrate and an organic electronic device according to one embodiment of the present invention.

Figure 1:
FIGS. 1, 2, 3A, 3B, 4, and 5 are schematic diagrams illustrating a method of manufacturing a fabric-based substrate and an organic electronic device according to one embodiment of the present invention.

Referring to FIG. 1, a base substrate 100 may be provided. The base substrate 100 has a flat upper surface and may be a glass substrate, a metal substrate, a semiconductor substrate, or a polymer substrate. Electrodes 10 may be formed on the base substrate 100. The electrode 10 may be a flexible electrode having flexibility. Specifically, the electrode 10 may be a conductive polymer electrode, a metal nanowire electrode, a metal mesh electrode, a carbon electrode, or a combination thereof. The conductive polymer electrode may be a poly(3,4-ethylenedioxythiophene) (PEDOT):polystyrene sulfonate (PSS) electrode or a poly aniline (PANI) electrode. The metal nanowire electrode may be an electrode in which metal nanowires are disposed to have a disordered network. The metal nanowire electrode may be a silver (Ag) nanowire electrode. The metal mesh electrode may be an Ag or copper (Cu) mesh electrode. The carbon electrode may be a graphite, graphene, or carbon nanotube electrode. For example, the electrode 10 may have a double layer structure of a conductive polymer 10b and a metal nanowire 10a.

The electrodes 10 may have a form patterned using a photolithography method and an etching method. For example, the electrode 10 may have line shapes extending in parallel on the base substrate 100 in one direction.

Figure 2:
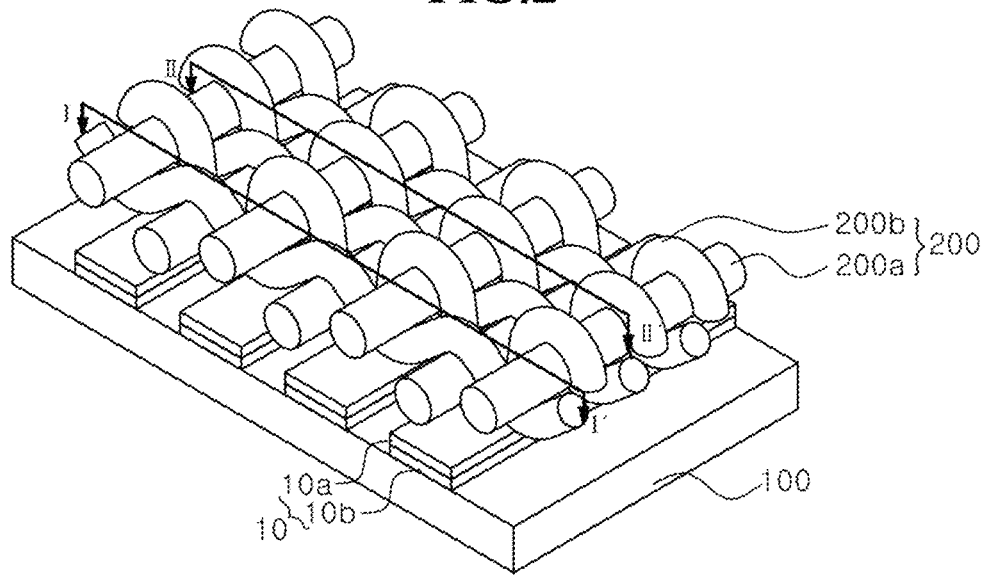

FIG. 2 is a perspective view illustrating fabric layers 200 disposed on the electrode 10 of FIG. 1. Referring to FIG. 2, the fabric layer 200 may be a network of natural or artificial fibers, may have numerous voids or pores between fibers and in the fibers, and may have excellent flexibility. However, the fabric layer 200 has a disadvantage of having a large surface step difference due to the fibers. The fabric layer 200 may be classified into a woven fabric layer, a knitted fabric layer, and a nonwoven fabric layer according to a shape of a fiber network. In the drawing, as an example of the fabric layer 200, the woven fabric layer in which a weft thread 200a and a warp thread 200b are intersected and woven is illustrated, but the present invention is not limited thereto. The fabric layer 200 may be a polymer fabric layer such as a polyethylene fabric layer, a polyester fabric layer, a nylon fabric layer, or a polyacrylic fabric layer, but the present invention is not limited thereto.

Figure 3A:
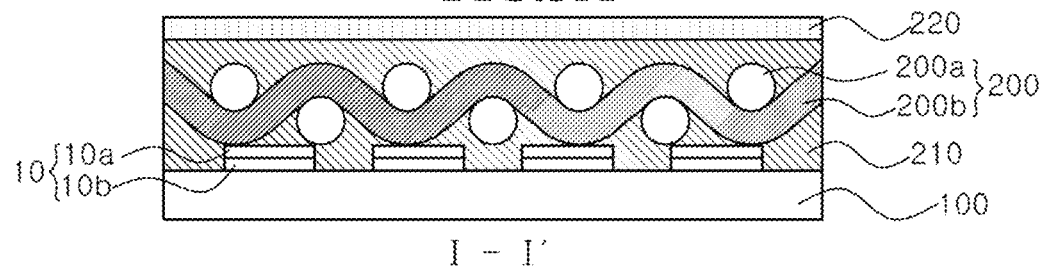
Figure 3B:
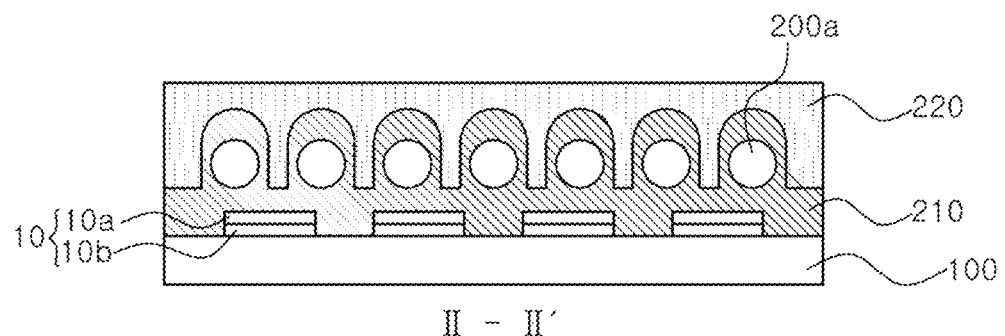

FIGS. 3A and 3B illustrate cross-sectional views in which an adhesive layer 210 and a self-healing polymer layer 220 are additionally formed based on cross sections taken along lines I-I' and II-II' of FIG. 2. In this case, the adhesive layer 210 and the self-healing polymer layer 220 may serve as planarization layers to cover surface steps or alleviate surface step differences of the upper surface of the fabric layer 200.

Referring to FIGS. 3A and 3B, as an example of an adhesive, an optical adhesive may be applied on the fabric layer 200. Such an adhesive may be an acrylic-based, silicone-based, epoxy-based, or urethane-based adhesive. The applied adhesive may be cured by light to form the adhesive layer 210. The adhesive layer 210 may be referred to as a photocurable resin layer.

The adhesive may be a liquid adhesive. The liquid adhesive may permeate into the fabric layer 200 through the pores in the fabric layer 200 to fill at least some or even all of an empty area between the fabric layer 200 and the electrode 10, an empty area between the electrodes 10, and the pores in the fabric layer 200. In addition, since the liquid adhesive is applied using a spin coating method, the degree of filling the empty areas or pores may be further improved, and flatness of the formed adhesive layer 210 may be improved.

Since the adhesive layer 210 is formed to fill at least some or even all of the empty area between the fabric layer 200 and the electrode 10, the empty area between the electrodes 10, and the pores in the fabric layer 200, the adhesive strength between the fabric layer 200 and the electrode 10 may be enhanced and, further, external moisture or external air may be blocked from entering an organic electronic device, which will be described below.

The adhesive layer 210 is a shape memory polymer layer and may be a polyurethane-based or epoxy-based shape memory polymer layer. To this end, the adhesive may be selected as a urethane-based or epoxy-based adhesive which is suitable as the shape memory polymer layer. For example, the adhesive layer 210 may be a thermosetting polyurethane layer, and specifically, an amorphous thermosetting polyurethane layer. Specifically, the adhesive layer 210 may be a polyurethane-based thiol-ene crosslinked polymer layer, that is, a thiol-ene-crosslinked polyurethane layer. When heat at a temperature that is higher than or equal to a glass transition temperature is applied to the adhesive layer 210, the adhesive layer 210 may have a shape memory characteristic of returning to its original shape.

The self-healing polymer layer 220 may be formed on the adhesive layer 210. The self-healing polymer layer 220 is a layer having a structure in which polymer chains are physically crosslinked and is a polymer layer capable of allowing, when physical crosslinking is broken by an external stimulus and damaged and then the damaged portions are brought into contact, the physical crosslinking to be restored to repair the damage. In this case, the physical crosslinking may be a hydrogen bond, a pi-pi interaction, an electrostatic attraction, or a dynamic coordination bond. For example, the self-healing polymer layer 220 may be a polymer layer containing polyvinyl alcohol crosslinked by hydrogen bonds and may have biocompatibility. Specifically, the self-healing polymer layer 220 may be a mixture of polyvinyl alcohol and a polysaccharide. The polysaccharide may be agar. In addition, as shown in FIG. 3B, the self-healing polymer layer 220 may additionally flatten a surface which is not yet flattened by the adhesive layer 210 in an area in which the surface step difference of the fabric layer 200 is too large. In addition, when the self-healing polymer layer 220 has biocompatibility, the self-healing polymer layer 220 may not damage human skin even when being in contact with the human skin.

Figure 4:
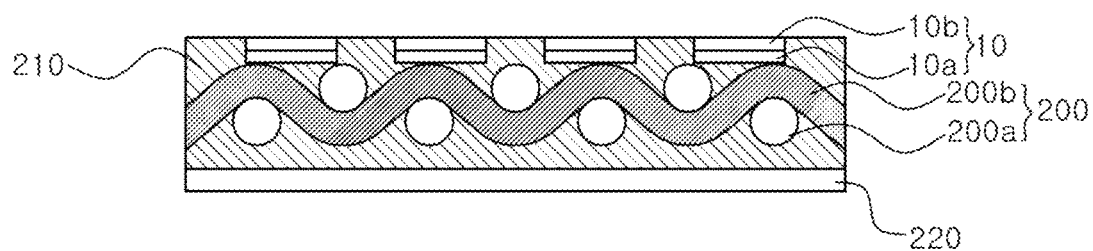

Referring to FIG. 4, the base substrate 100 may be removed from the resultant which is described with reference to FIGS. 3A and 3B. As a result, a fabric-based substrate on which the electrodes 10 and the adhesive layer 210 between the electrodes 10 are exposed at an upper surface may be obtained.

Previously, when the fabric layer 200 is disposed on the electrodes 10 of the base substrate 100, the fabric layer 200 having a size that is greater than a size of the base substrate 100 may be used so that an edge of the fabric layer 200 may not be overlapped by the base substrate 100. When the base substrate 100 is removed, the base substrate 100 may be removed by holding the edge of the fabric layer 200 not being overlapped by the base substrate 100 and physically applying a force.

The fabric-based substrate may include the fabric layer 200 having an upper surface and a lower surface, a plurality of electrodes 10 located on the upper surface of the fabric layer 200, and an adhesive layer 210 filled at least some of the empty spaces between the electrodes 10 and the fabric layer 200, between the electrodes 10, and the pores in the fabric layer 200. In addition, the fabric-based substrate may further include a self-healing polymer layer 220 disposed on the adhesive layer 210 which is located on the lower surface of the fabric layer 200.

Figure 5:
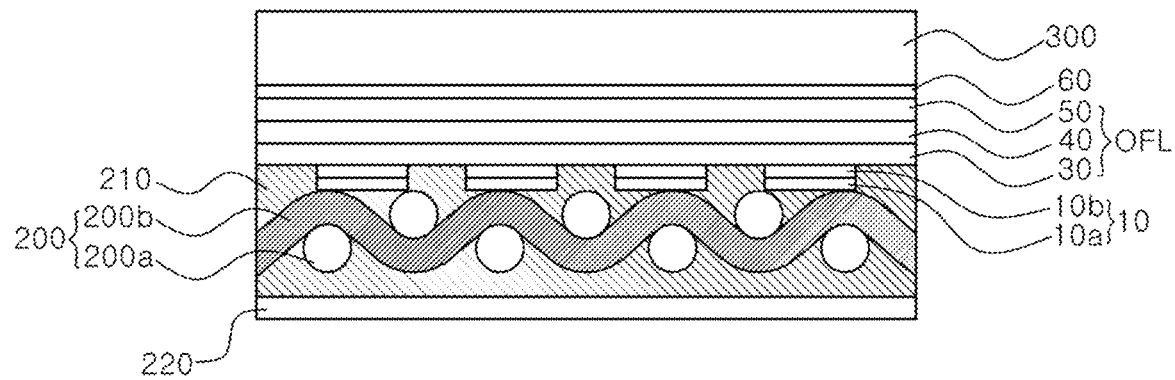

Referring to FIG. 5, an organic functional layer OFL may be formed on the exposed electrodes 10. In this case, the electrode 10 may be a first electrode 10, and a second electrode 60 may be formed on the organic functional layer OFL. In addition, an encapsulation film 300 may be formed on the second electrode 60 to protect the organic functional layer OFL from external air and/or external oxygen.

The organic functional layer OFL is a layer including an organic active layer 40 which performs a main function of an organic electronic device. When the organic electronic device is an organic light-emitting diode, the organic active layer 40 may be an organic light-emitting layer which emits light while excitons generated due to recombination of electrons and holes transition to a ground state. When the organic electronic device is an organic solar cell, the organic active layer 40 may be a photoactive layer in which excitons generated due to external light are separated into electrons and holes. When the organic electronic device is a sensor, the organic active layer 40 may be an organic semiconductor layer whose conductivity is varied with respect to a sensing target material. However, the present invention is not limited thereto.

For example, the organic light-emitting layer may be an $Alq_3$ layer, 5,6,11,12-tetraphenylnaphthacene (rubrene) layer, 2,5,8,11-tetra-tert-butyl perylene (TBP) layer, or the like, but the present invention is not limited thereto. The photoactive layer may be formed with a bi-layer structure (D/A) in which an electron donor (D) material and an electron acceptor (A) material form separated layers or a composite thin film structure (D+A blend). For example, the photoactive layer may be a composite thin film which is a mixture of P3HT as an electron donor material and a fullerene derivative ([6,6]-phenyl-C61 butyric acid methyl ester (PCBM)) as an electron acceptor material.

The organic functional layer OFL further includes a first charge injection/transport layer 30 between the organic active layer 40 and/or the first electrode 10 and a second charge injection/transport layer 50 between the organic active layer 40 and the second electrode 60.

For example, the first charge injection/transport layer 30 may be a hole injection/transport layer serving as a p-type organic semiconductor layer. Specifically, the hole injection/transport layer may be a double layer of a hole injection layer for example 1,4,5,8,9,11-hexaazatriphenylenehexacarbonitrile (HAT-CN) layer and a hole transport layer for example N,N'-bis(naphthalen-1-yl)-N,N'-bis(phenyl)-benzidine) (NPB). As described above, the conductive polymer 10b included in the first electrode 10 may serve to reduce the roughness of the surface of the metal nanowire 10a and may also serve as a hole injection layer.

The second charge injection/transport layer 50 may be an electron injection/transport layer serving as an n-type semiconductor layer. For example, the second charge injection/transport layer 50 may be made of 4,7-diphenyl-1,10-phenanthroline (Bphen). Alternatively, the second charge injection/transport layer 50 may be omitted.

The first charge injection/transport layer 30, the organic active layer 40, and the second charge injection/transport layer 50 may each be formed using an evaporation method or a coating method, regardless of each other.

The second electrode 60 may be formed of a metal having a work function that is lower than a work function of the first electrode 10, for example, aluminum, magnesium, calcium, sodium, potassium, indium, yttrium, lithium, Ag, lead, cesium, or a combination of two or more thereof. The second electrode 60 may be formed using a sputtering method, a vapor deposition method, or an ion beam deposition method.

As described above, the encapsulation film 300 may be a flexible material layer made of a material capable of protecting the organic functional layer OFL from external moisture and external oxygen. Specifically, the encapsulation film 300 may be a resin layer made of polycarbonate (PC), polyethylene terephthalate (PET), polyethylene naphthalate (PEN), polyimide (PI), or polypropylene (PP).

The above described fabric-based substrate and the organic electronic device including the same may be used as a wearable device because the organic electronic device may have flexibility due to the fabric-based substrate and may be easily embedded in clothes and the like. In addition, each of the fabric-based substrate and the organic electronic device including the same has the shape memory polymer layer as the adhesive layer 210. Thus, even when the shapes of the fabric-based substrate and the organic electronic device are deformed due to movement and the like of a user, the fabric-based substrate and the organic electronic device may be easily restored to their original shapes. In addition, since each of the fabric-based substrate and the organic electronic device including the same has the self-healing polymer layer 220 as a surface layer, when surface damage occurs, a damaged portion may be easily repaired. In addition, when the self-healing polymer layer 220 has biocompatibility, even when the fabric-based substrate and the organic electronic device including the same are worn to be brought into contact with human skin, the human skin may not be damaged.

Hereinafter, exemplary examples will be described in order to facilitate understanding of the present invention. It should be noted, however, that the following exemplary examples are only to help the understanding of the present invention, and the present invention is not limited by the following exemplary examples.

Example of Manufacturing Fabric-Based Substrate

A thin film was formed on a glass substrate through spin coating of PEDOT:PSS, and then heat treatment was performed at a temperature of 130° C. to form a PEDOT:PSS layer. An Ag nanowire layer was formed on the PEDOT:PSS layer by spin coating Ag nanowire dispersion solution on the PEDOT:PSS layer and then performing heat treatment at a temperature of 70° C. A photoresist pattern was formed on the Ag nanowire layer using photolithography, and then the Ag nanowire layer and the PEDOT:PSS layer were sequentially etched using the photoresist pattern as a mask to form electrodes. A woven fabric was disposed on the electrodes, and then spin coating was performed while a photocurable resin (NOA 63, Norland Products) was applied on the woven fabric so that the photocurable resin permeated into empty regions and pores in the woven fabric to form a photocurable resin thin film. Thereafter, the photocurable resin thin film was subjected to UV treatment to form a photocurable resin layer. Polyvinyl alcohol (PVA) and agar were mixed in a weight ratio of 10:1, spin coating was performed while the mixture of PVA and agar was applied on the photocurable resin layer to form a PVA:Agr thin film, and then heat treatment was performed at a temperature of 70° C. Thereafter, the glass substrate was removed to expose the electrode.

Example of Manufacturing Organic Light-Emitting Device

An organic light emitting device was manufactured by sequentially depositing HAT-CN, NPB, Alq3, Li, and Al on the exposed electrode of the fabric-based substrate, which was obtained in Example of manufacturing fabric-based substrate, using a thermal evaporation method.

FIGS. 6A, 6B, 6C, 6D, 6E, and 6F are photographs illustrating a process in which, after cracks occurred in the PVA:Agr thin film of a fabric-based substrate obtained in Example of manufacturing fabric-based substrate, the cracks were repaired.

Referring to FIGS. 6A, 6B, 6C, 6D, 6E, and 6F, it can be seen that, after cracks were generated in a portion of the fabric-based substrate (see FIGS. 6A and 6B) and then a predetermined period of time elapsed (see FIGS. 6C, 6D, and 6E), the cracks were almost completely self-repaired (see FIG. 6F).

FIGS. 7A and 7B are photographs illustrating the shape memory capability of the fabric-based substrate obtained in Example of manufacturing fabric-based substrate.

Referring to FIGS. 7A and 7B it can be seen that, when a portion of the fabric-based substrate was folded (see FIG. 7A) and then heated at a temperature of 100° C. for about 20 seconds, the folded portion was almost restored to its original state (see FIG. 7B).

FIG. 8 is a graph showing electroluminescence intensities according to wavelengths of an initial state, a damaged state, and a self-healed state of the organic light-emitting device obtained in Example of manufacturing organic light-emitting device. In this case, damage to the organic light-emitting device was caused by repeating a process of folding and unfolding the organic light-emitting device 1,000 times with a radius of 1 mm or less.

Referring to FIG. 8, it can be seen that, when compared with the damaged state, the organic light-emitting device exhibited higher electroluminescence intensity in the self-healed or self-repaired state which recovered from the damage.

As described above, in accordance with the present invention, a fabric-based substrate and an organic electronic device including the same can be used as a wearable device because the organic electronic device can have flexibility due to the fabric-based substrate and can be easily embedded in clothes and the like.

However, it should be noted that effects of the present invention are not limited to the above described effect, and other effects of the present invention not mentioned above can be clearly understood by those skilled in the art from the above description.

Although the present invention has been described in detail with reference to the exemplary embodiments, the present invention is not limited to the above described exemplary embodiments, and various modifications and alternations can be devised by those skilled in the art without departing from the technical spirit and scope of the present invention.

What is claimed is:

1. A fabric-based substrate comprising:
   a fabric layer having an upper surface and a lower surface;
   a plurality of electrodes disposed on the upper surface of the fabric layer;
   an adhesive layer provided on the upper surface and the lower surface of the fabric layer and filled at least some empty spaces between the electrodes and the fabric layer, between the electrodes, and at least some pores in the fabric layer; and
   a self-healing polymer layer disposed on the adhesive layer located on the lower surface of the fabric layer,
   wherein the adhesive layer is a shape memory polymer layer.

2. The fabric-based substrate of claim 1, wherein the adhesive layer is an amorphous thermosetting polyurethane layer.

3. The fabric-based substrate of claim 1 wherein the adhesive layer is a thiol-ene crosslinked polyurethane layer.

4. The fabric-based substrate of claim 1, wherein the self-healing polymer layer is a polymer layer crosslinked by hydrogen bonds.

5. The fabric-based substrate of claim 4, wherein the self-healing polymer layer is a polymer layer containing polyvinyl alcohol.

6. A fabric-based substrate comprising:
   a fabric layer having an upper surface and a lower surface;
   a plurality of electrodes disposed on the upper surface of the fabric layer;
   an adhesive layer provided on the upper surface and the lower surface of the fabric layer and filled at least some empty spaces between the electrodes and the fabric layer, between the electrodes, and at least some pores in the fabric layer; and
   a self-healing polymer layer disposed on the adhesive layer located on the lower surface of the fabric-layer,
   wherein the self-healing polymer layer is a polymer layer crosslinked by hydrogen bonds, and
   wherein the self-healing polymer layer is a mixture of polyvinyl alcohol and a polysaccharide.

7. A method of manufacturing a fabric-based substrate of claim 1, comprising:
   forming electrodes on a base substrate;
   disposing a fabric layer on the electrodes;
   applying a liquid adhesive on the fabric layer and then curing the liquid adhesive to form an adhesive layer;
   forming a self-healing polymer layer on the adhesive layer; and
   removing the base substrate from the resultant in which the self-healing polymer layer is formed to expose the electrodes and the adhesive layer located between the electrodes.

8. The method of claim 7, wherein the base substrate is a glass substrate.

9. The method of claim 7, wherein the liquid adhesive is a urethane-based or epoxy-based adhesive.

10. The method of claim 7, wherein the liquid adhesive is applied using a spin coating method.

11. An organic electronic device comprising:
    a fabric layer having an upper surface and a lower surface;

a plurality of electrodes disposed on the upper surface of the fabric layer;

an adhesive layer provided on the upper surface and the lower surface of the fabric layer and filled at least some empty spaces between the electrodes and the fabric layer, between the electrodes, and at least some pores in the fabric layer;

a self-healing polymer layer disposed on the adhesive layer located on the lower surface of the fabric layer; and an organic functional layer disposed on the electrodes, wherein the adhesive layer is a shape memory polymer layer.

12. The organic electronic device of claim 11, wherein the organic functional layer includes an organic light-emitting layer or a photoactive layer, and the electrodes may be first electrodes, and further comprising a second electrode disposed on the organic functional layer.

13. The organic electronic device of claim 12, further comprising at least one of a first charge injection/transport layer disposed between the first electrode and the organic functional layer and a second charge injection/transport layer disposed between the organic functional layer and the second electrode.

14. The organic electronic device of claim 11, further comprising an encapsulation film disposed on the organic functional layer.

* * * * *